(12) United States Patent
Yoshiike

(10) Patent No.: US 9,682,554 B2
(45) Date of Patent: Jun. 20, 2017

(54) BONDED STRUCTURE, PIEZOELECTRIC DEVICE, LIQUID EJECTING HEAD, AND METHOD OF MANUFACTURING BONDED STRUCTURE

(71) Applicant: SEIKO EPSON CORPORATION, Tokyo (JP)

(72) Inventor: Masashi Yoshiike, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/238,103

(22) Filed: Aug. 16, 2016

(65) Prior Publication Data
US 2017/0050437 A1 Feb. 23, 2017

(30) Foreign Application Priority Data
Aug. 21, 2015 (JP) ................. 2015-163473

(51) Int. Cl.
B41J 2/045 (2006.01)
B41J 2/14 (2006.01)
H01L 41/047 (2006.01)
H01L 41/27 (2013.01)
H01L 41/297 (2013.01)

(52) U.S. Cl.
CPC ...... *B41J 2/14201* (2013.01); *H01L 41/0471* (2013.01); *H01L 41/27* (2013.01); *H01L 41/297* (2013.01)

(58) Field of Classification Search
CPC . B41J 2/14201; B41J 2/14233; B41J 2/14274
See application file for complete search history.

(56) References Cited

U.S. PATENT DOCUMENTS

2013/0194353 A1* 8/2013 Hirai ................. B41J 2/1631
347/71

FOREIGN PATENT DOCUMENTS

JP 2000-289197 A 10/2000
JP 2009-252882 A 10/2009

* cited by examiner

*Primary Examiner* — Juanita D Jackson
(74) *Attorney, Agent, or Firm* — Workman Nydegger

(57) ABSTRACT

Provided is a bonded structure including a first substrate in which a resin portion made of an elastic member protrudes on one surface and a first electrode layer is formed to cover at least a part of the resin portion, and a second substrate in which a second electrode layer electrically connected to the first electrode layer is formed on a surface facing the first substrate, the first substrate and the second substrate being bonded to each other in a state in which a photosensitive adhesive is interposed therebetween. In a surface of one of the first substrate and the second substrate on the photosensitive adhesive side, a first region reflecting light and a second region less likely to reflect light than the first region are provided in positions different from each other on a region overlapping the photosensitive adhesive in a substrate bonding direction.

14 Claims, 10 Drawing Sheets ium patent application No. 2015-163473 filed on Aug. 21, 2015, which is hereby incorporated by reference in its entirety.

BONDED STRUCTURE, PIEZOELECTRIC DEVICE, LIQUID EJECTING HEAD, AND METHOD OF MANUFACTURING BONDED STRUCTURE

CROSS-REFERENCE TO RELATED APPLICATIONS

The present application claims priority to Japanese Patent Application No. 2015-163473 filed on Aug. 21, 2015, which is hereby incorporated by reference in its entirety.

BACKGROUND

1. Technical Field

The present invention relates to a bonded structure including a first substrate in which a first electrode layer is formed and a second substrate in which a second electrode layer electrically connected with the first electrode layer is formed, a piezoelectric device and a liquid ejecting head which include the bonded structure, and a method of manufacturing the bonded structure.

2. Related Art

A bonded structure in which a first substrate having a first electrode layer and a second substrate having a second electrode layer are bonded with each other in a state of being electrically connected is built into various electronic devices. For example, a piezoelectric device which is a type of the bonded structure is applied to various liquid ejecting apparatuses, vibration sensors, and the like. Such a piezoelectric device is provided with a piezoelectric element in one of the first substrate and the second substrate described above, and allows the piezoelectric element to function as an actuator, a sensor, or the like. For example, in the liquid ejecting apparatus, the piezoelectric device is built into a liquid ejecting head, and liquid is ejected from a nozzle formed on the liquid ejecting head by driving the piezoelectric element.

In addition, as such a liquid ejecting apparatus, for example, an image recording apparatus such as an ink jet type printer, an ink jet type plotter, or the like is used. Recently, the liquid ejecting apparatus is also used for various manufacturing apparatuses by utilizing an advantage thereof that a very small amount of liquid is capable of being accurately landed onto a predetermined position. For example, such liquid ejecting apparatus is applied to a display manufacturing apparatus for manufacturing a color filter of a liquid crystal display or the like, an electrode forming apparatus for forming an electrode of an organic electro luminescence (EL) display, a field emission display (FED), or the like, and a chip manufacturing apparatus for manufacturing a biochip (biochemical element). A recording head for an image recording apparatus discharges liquid type ink, and a color material discharging head for a display manufacturing apparatus discharges a solution of each color material of red (R), green (G), and blue (B). In addition, an electrode material discharging head for an electrode forming apparatus discharges a liquid type electrode material, and a bio organic material discharging head for a chip manufacturing apparatus discharges a solution of bio organic material.

The first electrode layer of the first substrate and the second electrode layer of the second substrate in the bonded structure described above are electrically connected to each other through a bump. In a case where both electrodes are electrically connected through such a bump, in order to reliably connect the bump with the electrode layer facing the bump, pressure is applied when the first substrate and the second substrate are bonded to each other. In this state, the first substrate and the second substrate are bonded. In addition, as an adhesive for bonding the first substrate and the second substrate to each other, an adhesive having photosensitivity is used because it is possible to form a high precision pattern by suppressing wetting and spreading (for example, refer to JP-A-2000-289197).

When the first substrate and the second substrate are bonded to each other, if the photosensitive adhesive before bonding is excessively hard, there is a concern that a bonding force between both the substrates after bonding is deteriorated. Meanwhile, if the photosensitive adhesive before bonding is excessively soft, there is a concern that pressure is focused on the bump at the time of bonding both the substrates, and a shape of the bump is deformed or broken. Particularly, in a case where a resin core bump is used in which a part of the electrode layer is stacked on a surface of a resin portion having elasticity, as the bump, there is a concern that the electrode layer stacked on the surface of the resin portion is disconnected.

SUMMARY

An advantage of some aspects of the invention is to provide a bonded structure, a piezoelectric device, and a liquid ejecting head in which a bonding force between a first substrate and a second substrate can be increased while suppressing disconnection of an electrode layer, and a method of manufacturing the bonded structure.

A bonded structure according to an aspect of the invention includes a first substrate in which a resin portion made of an elastic member protrudes on one surface and a first electrode layer is formed to cover at least a part of the resin portion, and a second substrate in which a second electrode layer electrically connected to the first electrode layer is formed on a surface facing the first substrate, the first substrate and the second substrate being bonded to each other in a state in which a photosensitive adhesive is interposed therebetween. In a surface of one of the first substrate and the second substrate on the photosensitive adhesive side, a first region reflecting light and a second region less likely to reflect light than the first region are provided in positions different from each other on a region overlapping the photosensitive adhesive in a substrate bonding direction.

According to the bonded structure, when the photosensitive adhesive is patterned by applying light, the photosensitive adhesive formed on the first region may be further cured than the photosensitive adhesive formed on the second region. Accordingly, when the first substrate and the second substrate are bonded to each other in a state in which the first electrode layer and the second electrode layer are electrically connected by applying pressure, the pressure may be dispersed to a connection region where the first electrode layer and the second electrode layer abut onto each other, and the photosensitive adhesive formed on the first region. As a result, disconnection of the first electrode layer due to the pressure applied to the connection region may be suppressed. In addition, the photosensitive adhesive formed on the second region is softer than the photosensitive adhesive formed on the first region, and thus a sticking force with respect to facing substrates, that is, an adhesion force is increased. Accordingly, a bonding force between the first substrate and the second substrate may be increased.

In the bonded structure, it is preferable that at least a part of the photosensitive adhesive is formed on a region deviated to one side in an in-bonding-surface direction from the connection region where the first electrode layer and the second electrode layer abut onto each other and a region deviated to the other side from the connection region, and the connection region is disposed between the photosensitive adhesives on the both sides.

According to the bonded structure, when the first substrate and the second substrate are bonded to each other, the facing substrates may be supported by the photosensitive adhesive formed on both sides of the connection region. As a result, disconnection of the first electrode layer may be further suppressed.

In the bonded structure, it is preferable that the first region is a region where the photosensitive adhesive and a metal layer intersect each other.

According to the bonded structure, the first region may be easily formed. As a result, the piezoelectric device may be easily manufactured.

In the bonded structure, it is preferable that a space formed by recessing a surface on the opposite side to the photosensitive adhesive side is provided on a region overlapping at least a part of the photosensitive adhesive in the substrate bonding direction in one of the first substrate and the second substrate, and the second region is a region corresponding to the space of the one substrate.

According to the bonded structure, the photosensitive adhesive formed on the second region is softer than the photosensitive adhesive formed on the first region, and thus pressure being applied to a region corresponding to the space may be suppressed, when the first substrate and the second substrate are bonded to each other. As a result, breaking of the substrate in which the space is provided may be suppressed.

A piezoelectric device according to another aspect of the invention includes the bonded structure described above and a piezoelectric element that is formed on one of the first substrate and the second substrate and electrically connected to the first electrode layer and the second electrode layer.

A liquid ejecting head according to still another aspect of the invention includes the piezoelectric device described above, a pressure chamber of which the volume changes due to deformation of the piezoelectric element, and a nozzle that communicates with the pressure chamber.

A method of manufacturing a bonded structure according to still another aspect of the invention, the bonded structure including a first substrate in which a resin portion made of an elastic member protrudes on one surface and a first electrode layer is formed to cover at least a part of the resin portion, and a second substrate in which a second electrode layer electrically connected to the first electrode layer is formed on a surface facing the first substrate, the first substrate and the second substrate being bonded to each other in a state in which a photosensitive adhesive is interposed therebetween. The method includes forming a photosensitive adhesive layer on one of the first substrate and the second substrate, applying light to the photosensitive adhesive layer on the one substrate to form the photosensitive adhesives having different hardness in positions different from each other and removing the other photosensitive adhesive, and bonding the first substrate and the second substrate to each other by further curing the photosensitive adhesive in a state in which the first electrode layer and the second electrode layer are connected to each other.

According to the method, since the hardness of the photosensitive adhesives are set different in the applying light, even when pressure is applied between the first substrate and the second substrate so as to electrically connect the first electrode layer and the second electrode layer in the bonding, the pressure may be dispersed to a connection region where the first electrode layer and the second electrode layer abut onto each other and to a photosensitive adhesive formed harder than the other photosensitive adhesive. As a result, disconnection of the first electrode layer due to the pressure applied to the connection region may be suppressed. In addition, a sticking force with respect to the facing substrates, that is, an adhesion force may be increased by the photosensitive adhesive which is softer than the other photosensitive adhesive. Accordingly, a bonding force between the first substrate and the second substrate may be increased.

In addition, the method may further include forming a metal layer on a first region on which at least a part of the photosensitive adhesive is formed in a surface of the one substrate where the photosensitive adhesive is formed. In the applying light, light incident on the photosensitive adhesive layer is reflected by the metal layer, and the photosensitive adhesive in the first region is further cured than a photosensitive adhesive in a second region deviated from the first region.

According to the method, the hardness of the photosensitive adhesive layer in the first region and the photosensitive adhesive layer in the second region may be easily set to be different from each other. As a result, the piezoelectric device is easily manufactured.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments for realizing the invention will be described referring to attached drawings. Also, embodiments to be described hereinafter are variously limited as preferred examples of the invention; however, a range of the invention is not limited to these aspects, as long as there is no disclosure of an effect of particularly limiting the invention in the description as follow. In addition, hereinafter, an ink jet type recording head (hereinafter, recording head) which is a type of a liquid ejecting head provided with a piezoelectric device including a bonded structure according to the invention, and an ink jet type printer (hereinafter, printer), which is a type of a liquid ejecting apparatus mounted with the head, are described as an example.

Figure 1:
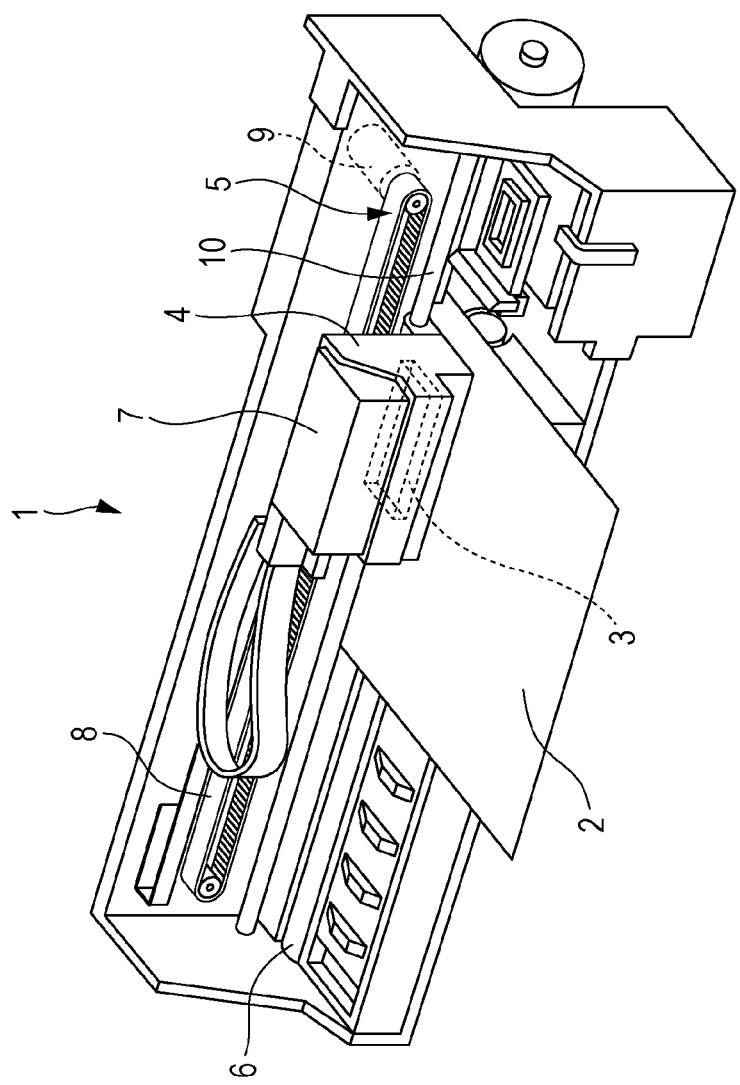
FIG. 1 is a perspective view describing a configuration of a printer.

A configuration of a printer 1 will be described with reference to FIG. 1. The printer 1 is a device which records an image, or the like by ejecting ink (a type of liquid) onto a surface of a recording medium 2 such as recording paper (a type of a target where the ink is landed). Such a printer 1 is provided with a recording head 3, a carriage 4 mounted in the recording head 3, a carriage moving mechanism 5 which moves the carriage 4 in a main scanning direction, a transportation mechanism 6 which transports the recording medium 2 in a sub scanning direction, and the like. Here, the ink described above is accumulated in an ink cartridge 7 as a liquid supplying source. The ink cartridge 7 is detachably mounted with respect to the recording head 3. Also, a configuration in which the ink cartridge is disposed on a main body side of the printer, and the ink is supplied from the ink cartridge to the recording head through an ink supplying tube, can be adopted.

The carriage moving mechanism 5 described above includes a timing belt 8. The timing belt 8 is driven by a pulse motor 9 such as a DC motor. Therefore, when the pulse motor 9 is operated, the carriage 4 is guided to a guide rod 10 installed in the printer 1, and reciprocates in the main scanning direction (width direction of recording medium 2). A position of the main scanning direction of the carriage 4 is detected by a linear encoder (not illustrated) which is a type of position information detecting means. The linear encoder transfers a detection signal thereof, that is, an encoder pulse (a type of position information) to a controller of the printer 1.

Figure 2:
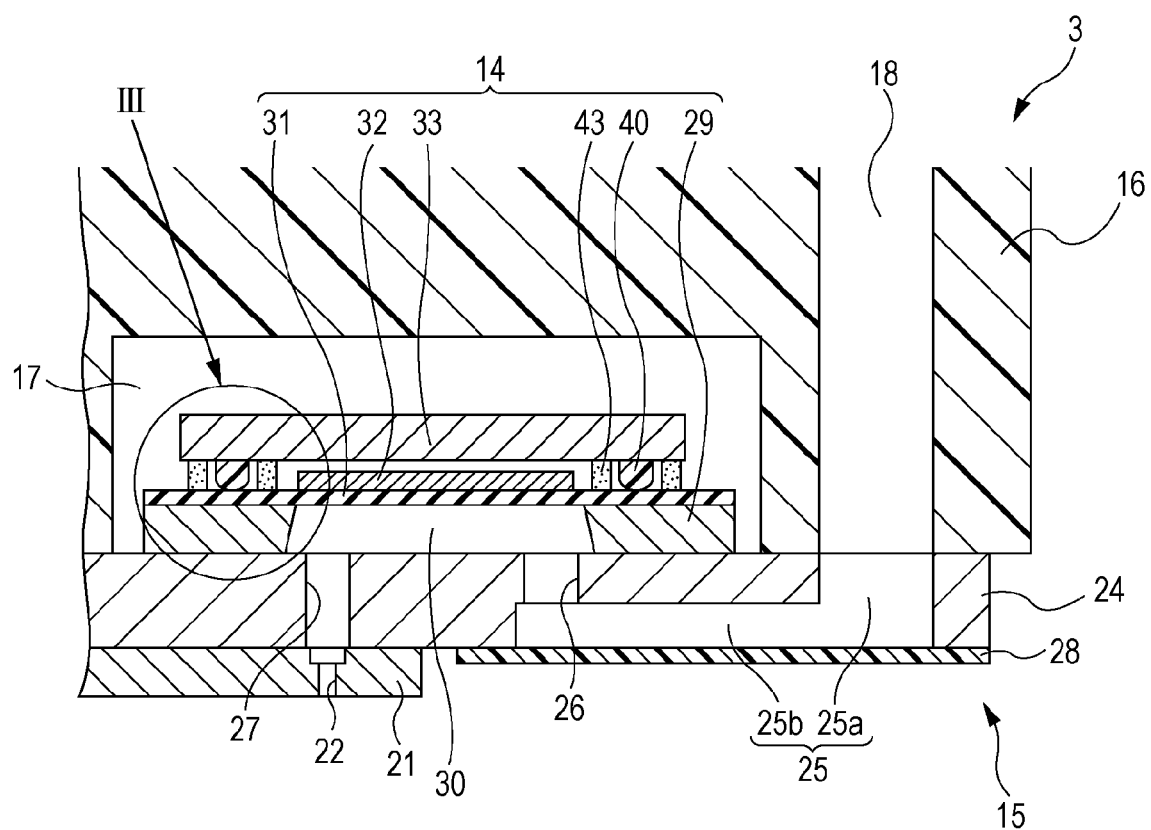
FIG. 2 is a sectional view describing a configuration of a recording head.
Figure 3:
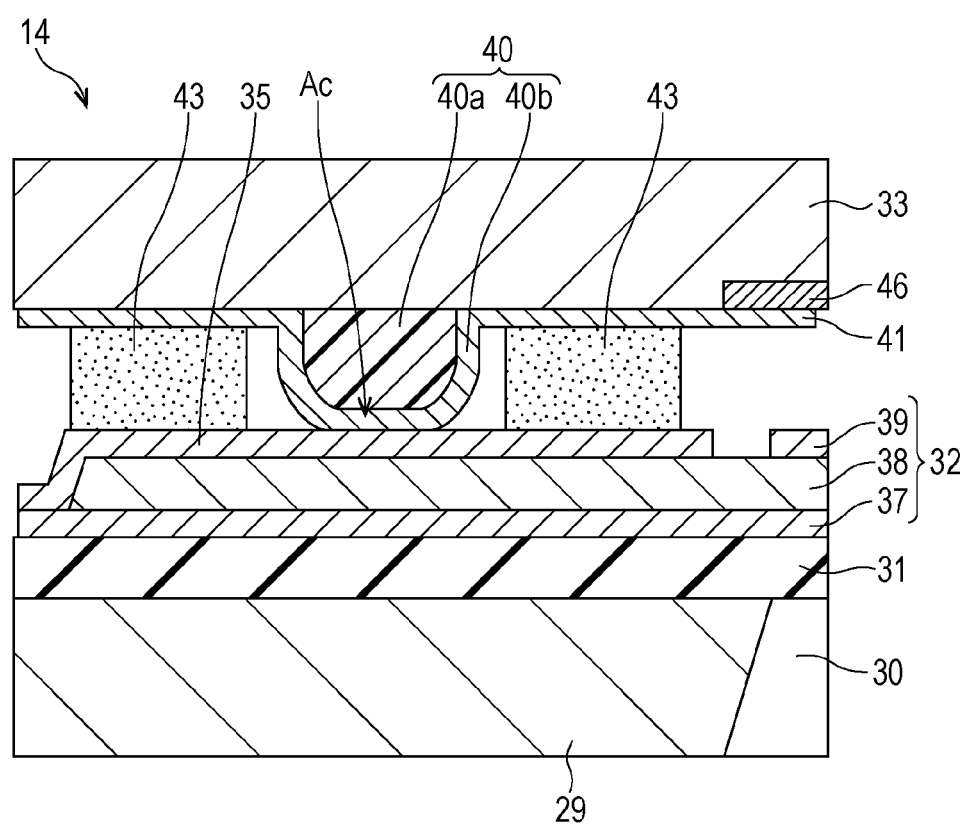
FIG. 3 is an enlarged sectional view of a region III in FIG. 2.

Next, the recording head 3 will be described. FIG. 2 is a sectional view describing a configuration of the recording head 3. FIG. 3 is an enlarged sectional view of a region III in FIG. 2, and a sectional view of an enlarged bonding portion of a resin core bump 40. As illustrated in FIG. 2, the recording head 3 in the embodiment is mounted in a head case 16 in a state in which a piezoelectric device 14 and a flow passage unit 15 are stacked. Moreover, for the sake of convenience, a stacked direction of each member will be described as a vertical direction.

The head case 16 is a box shaped member made of a synthetic resin, and a liquid introducing passage 18 which supplies ink to a common liquid chamber 25 to be described later is formed therein. The liquid introducing passage 18 and the common liquid chamber 25 are a space where a common ink is accumulated in pressure chambers 30 which are arranged in parallel. In addition, an accommodation space 17 which is recessed in a rectangular shape from a lower surface side of the head case 16 to an intermediate position of a height direction of the head case 16, is formed further inside than the liquid introducing passage 18 of the head case 16. When the flow passage unit 15 is bonded to a lower surface of the head case 16 in a state in which a position thereof is determined, the piezoelectric device 14 (pressure chamber forming substrate 29, sealing plate 33, and the like) stacked on a communication substrate 24 is accommodated in the accommodation space 17.

The flow passage unit 15 bonded to a lower surface of the head case 16 includes the communication substrate 24, a nozzle plate 21, and a compliance sheet 28. The communication substrate 24 is a plate material made of silicon, and in the embodiment, the substrate is made of a silicon single crystal substrate in which a surface (upper surface and lower surface) of a crystal plane orientation is set as a (110) plane. In the communication substrate 24, as illustrated in FIG. 2, the liquid introducing passage 18 is communicated therewith, and the common liquid chamber 25, where ink common to each pressure chamber 30 is accumulated, and an individual communicating passage 26, which individually supplies the ink from the liquid introducing passage 18 to each pressure chamber 30 through the common liquid chamber 25, are formed by etching. The common liquid chamber 25 is an empty part elongated along a nozzle row direction. The common liquid chamber 25 in the embodiment is configured of a first liquid chamber 25a penetrating the communication substrate 24 in a thickness direction, and a second liquid chamber 25b which is formed to be recessed to an intermediate position of the thickness direction of the communication substrate 24, from a lower surface side toward the upper surface side of the communication substrate 24 in a state in which a thin plate portion is left on the upper surface side. The individual communicating passages 26 are formed on the thin plate portion of the second liquid chamber 25b along a juxtaposing direction of the pressure chamber 30 by being corresponded to the pressure chamber 30. The individual communicating passage 26 is communicated with an end portion of one side in a longitudinal direction of the corresponding pressure chamber 30 in a state in which the communication substrate 24 and the pressure chamber forming substrate 29 are bonded to each other.

In addition, a nozzle communicating passage 27 which penetrates the thickness direction of the communication substrate 24 is formed at a position corresponding to each nozzle 22 of the communication substrate 24. That is, the nozzle communicating passage 27 is formed in plural along a nozzle row direction corresponding to a nozzle row. The pressure chamber 30 and the nozzle 22 are communicated with each other by the nozzle communicating passage 27. The nozzle communicating passage 27 of the embodiment is communicated with an end portion of the other side (opposite side of individual communicating passage 26) in the longitudinal direction of the corresponding pressure chamber 30 in a state in which the communication substrate 24 and the pressure chamber forming substrate 29 are bonded to each other.

In a lower surface (surface of opposite side of pressure chamber forming substrate 29) of the communication substrate 24, the nozzle plate 21 and the compliance sheet 28 are bonded to each other. The nozzle plate 21 in the embodiment is formed of a silicon substrate (for example, silicon single crystal substrate), and is bonded to a region deviated from a region corresponding to the common liquid chamber 25 of the communication substrate 24. In the nozzle plate 21, a plurality of nozzles 22 are installed in a straight line shape (in a row). The plurality of nozzles 22 (nozzle row) which are arranged in parallel (provided in a row) are provided with an equivalent interval along a sub scanning direction orthogonal to a main scanning direction at a pitch (for example, 600 dpi) corresponding to a dot forming density from the nozzle 22 of one end side to the nozzle 22 of the other end side. The compliance sheet 28 is a member having flexibility and bonded to a region deviated from the nozzle plate 21 of a lower surface of the communication substrate 24 in a state of shielding an opening of the common liquid chamber 25. The compliance sheet 28 has a function of absorbing a pressure change of the ink inside the common liquid chamber 25.

As illustrated in FIG. 2, the piezoelectric device 14 of the embodiment is formed as a unit where the pressure chamber forming substrate 29, a vibration plate 31, the piezoelectric element 32, and the sealing plate 33 are stacked, and is accommodated in the accommodation space 17.

The pressure chamber forming substrate 29 is a hard plate material made of silicon, and in the embodiment, the substrate is made of a silicon single crystal substrate in which a crystal plane orientation of a surface (upper surface and lower surface) is set as a (110) plane. In the pressure chamber forming substrate 29, a part thereof is completely removed in the thickness direction by etching, and spaces to be the pressure chambers 30 are arranged in parallel along a nozzle row direction. Regarding the space, a bottom side thereof is divided by the communication substrate 24 and an upper side thereof is divided by the vibration plate 31 so as to constitute the pressure chamber 30. In addition, the space (that is, pressure chamber 30) is formed by causing the pressure chamber forming substrate 29, on which the vibration plate 31 is stacked, to be recessed to the lower surface side (opposite side of vibration plate 31) by etching in a state in which the vibration plate 31 is left on the upper surface side. Each of the pressure chambers 30 is formed to be elongated in a direction orthogonal to the nozzle row direction, the individual communicating passage 26 is communicated with an end portion of one side of the longitudinal direction, and the nozzle communicating passage 27 is communicated with an end portion of the other side.

The vibration plate 31 is a thin film shape having elasticity, and is stacked on the upper surface (surface of opposite side of communication substrate 24 side) of the pressure chamber forming substrate 29. An upper opening of a space to be the pressure chamber 30 is sealed with the vibration plate 31. In other words, the upper surface of the pressure chamber 30 is divided by the vibration plate 31. A part corresponding to the pressure chamber 30 (in detail, upper opening of pressure chamber 30) in the vibration plate 31 functions as a displacement portion which is displaced in a direction far away from or a direction close to the nozzle 22 according to bending deformation of the piezoelectric element 32. That is, a region corresponding to the upper opening of the pressure chamber 30 in the vibration plate 31 becomes a driving region where the bending deformation is allowed. A volume of the pressure chamber 30 is changed by deforming (displacing) of the driving region (displacement portion). Meanwhile, a region deviated from the upper opening of the pressure chamber 30 in the vibration plate 31 becomes a non driving region where the bending deformation is inhibited.

Also, the vibration plate 31 is formed of, for example, an elastic film made of silicon dioxide ($SiO_2$) which is formed on the upper surface of the pressure chamber forming substrate 29, and an insulating film made of zirconium dioxide ($ZrO_2$), which is formed on the elastic film. The piezoelectric element 32 is respectively stacked on a region (that is, driving region) corresponding to each of the pressure chambers 30 on the insulating film (surface of opposite side of pressure chamber forming substrate 29 side of vibration plate 31). Each of the piezoelectric elements 32 corresponds to the pressure chambers 30 which are provided in parallel along the nozzle row direction, and is provided in parallel along the nozzle row direction. Also, the pressure chamber forming substrate 29 and the vibration plate 31 stacked thereon correspond to the second substrate in the invention.

The piezoelectric element 32 of the embodiment is a piezoelectric element of a so called bending mode. As illustrated in FIG. 3, the piezoelectric element 32 is provided with a lower electrode layer 37, a piezoelectric layer 38, and an upper electrode layer 39 which are sequentially stacked on the vibration plate 31. That is, a part, in which the lower electrode layer 37, the piezoelectric layer 38, and the upper electrode layer 39 are stacked, becomes the piezoelectric element 32. The piezoelectric element 32 configured as described above is bent and deformed in a direction far away from or a direction close to the nozzle 22 if an electric field in accordance with a potential difference of both electrodes between the lower electrode layer 37 and the upper electrode layer 39 is applied. In the embodiment, the lower electrode layer 37 is an individual electrode which is independently formed in each piezoelectric element 32, and the upper electrode layer 39 is a common electrode which is successively formed over a plurality of the piezoelectric elements 32. That is, the lower electrode layer 37 is formed in each pressure chamber 30. Meanwhile, the upper electrode layer 39 is formed over a plurality of the pressure chambers 30.

Moreover, the piezoelectric layer 38 in the embodiment extends from a region which becomes the piezoelectric element 32 over a region corresponding to the resin core bump 40 to a position near the end portion of the vibration plate 31. The piezoelectric layer 38 of a region (a region deviated from the piezoelectric element 32) extending from the piezoelectric element 32 is successively formed over a plurality of the piezoelectric elements 32. In addition, the lower electrode layer 37 in the embodiment extends from a region which becomes the piezoelectric element 32 further to the particular outside than the piezoelectric layer 38 along a direction orthogonal to the nozzle row direction. a lead electrode layer 35 (corresponding to the second electrode layer in the invention) is connected to a part exposed in the outside further than the piezoelectric layer 38 of the lower electrode layer 37. The lead electrode layer 35 is a wiring which supplies a driving signal for driving the piezoelectric element 32 to the lower electrode layer 37, corresponds to the lower electrode layer 37 formed in each pressure chamber 30, and is formed in each pressure chamber 30. In addition, as illustrated in FIG. 3, the lead electrode layer 35 extends from the end portion of the vibration plate 31 toward the piezoelectric element 32 side along a direction orthogonal to the nozzle row direction. That is, the lead electrode layer 35 extends from a part where the lower electrode layer 37 is exposed to a top of the piezoelectric layer 38. Also, the lead electrode layer 35 is connected to the resin core bump 40 in a region where the piezoelectric element 32 (upper electrode layer 39) is not overlapped. Moreover, the lead electrode layer 35 is disposed to have a gap so as not to conduct with the upper electrode layer 39. In addition, the upper electrode layer 39, the lower electrode layer 37, and the lead electrode layer 35 are made of a metal (such as gold (Au), titanium (Ti), aluminum (Al), chromium (Cr), nickel (Ni), copper (Cu), or alloys of these). For this reason, the lead electrode layer 35 has higher reflectance with respect to light than the piezoelectric layer 38 which is a ground.

As illustrated in FIG. 2, the sealing plate 33 (corresponding to the first substrate in the invention) is a flat plate shape substrate which is disposed with a gap with respect to the vibration plate 31 (or piezoelectric element 32). Also, the gap is set as a gap in a degree where deforming of the piezoelectric element 32 is not inhibited. In the embodiment, the substrate is manufactured of a silicon single crystal substrate in which the crystal plane orientation of a surface (upper surface and lower surface) is set as (110) plane. As illustrated in FIG. 3, in a region facing the piezoelectric element 32 of the sealing plate 33, a driving circuit 46

(driver circuit) which outputs a signal (driving signal) for individually driving each piezoelectric element 32 is formed. The driving circuit 46 is made on a surface of the silicon single crystal substrate (silicon wafer) which becomes the sealing plate 33 by a semiconductor process (that is, film forming process, photolithography process, etching process, and the like).

In addition, in a region deviated from a region facing the pressure chamber 30 in the lower surface of the sealing plate 33, a plurality of resin core bumps 40 which output the driving signal from the driving circuit 46 to the piezoelectric element 32 side are protruded toward the vibration plate 31 side. As illustrated in FIG. 3, the resin core bumps 40 are formed at a position corresponding to the lead electrode layer 35, or the like along the nozzle row direction. Also, each of the resin core bumps 40 are respectively connected to the corresponding lead electrode layer 35, or the like.

The resin core bump 40 has elasticity, and is configured to secure a bonding area with the lead electrode layer 35 by being elastically deformed. Specifically, as illustrated in FIG. 3, the resin core bump 40 is provided with a resin portion 40*a* which is made of an elastic member protruded to the lower surface of the sealing plate 33, and an electrode layer 40*b* (corresponding to first electrode layer in the invention) which is formed along a surface of an opposite side of the sealing plate 33 of the resin portion 40*a* and covers at least a part of the resin portion 40*a*. The resin portion 40*a* in the embodiment is formed to protrude along the nozzle row direction in the lower surface of the sealing plate 33. In addition, a plurality of the electrode layers 40*b* are formed along the nozzle row direction by being corresponded to the piezoelectric element 32 provided in parallel along the nozzle row direction. Each of the electrode layers 40*b* extends in a direction orthogonal to the nozzle row direction from the resin portion 40*a* in the lower surface of the sealing plate 33, and becomes a driving wiring 41. The driving wiring 41 is a wiring connected to the resin core bump 40 and the driving circuit 46, and extends from a position overlapping with the driving circuit 46 over a position overlapping with the resin portion 40*a* to a region at an end portion of the sealing plate 33. That is, the driving wiring 41 is disposed at both sides of the resin core bump 40 in a direction orthogonal to the nozzle row direction.

Moreover, a surface (lower surface of resin core bump 40) of a side facing the lead electrode layer 35 of the resin portion 40*a* and the electrode layer 40*b* is covered in an arc shape toward the pressure chamber forming substrate 29 side when seen from a section in a direction orthogonal to the nozzle row direction. A part in an arc shape of the lower surface is pressed in the corresponding lead electrode layer 35 and is elastically deformed, and thus the electrode layer 40*b* and the lead electrode layer 35 are conducted with each other. Accordingly, an area of the connecting region Ac where the electrode layer 40*b* and the lead electrode layer 35 are conducted with each other can be secured.

Moreover, as the resin portion 40*a*, for example, a resin made of polyimide resin, phenol resin, epoxy resin, or the like is used. In addition, as the electrode layer 40*b*, that is, as the driving wiring 41, for example, a metal made of gold (Au), titanium (Ti), aluminum (Al), chromium (Cr), nickel (Ni), copper (Cu), or an alloy of these metals is used. For this reason, a surface of the driving wiring 41 has higher reflectance with respect to light than the other region in the lower surface of the sealing plate 33. That is, in the embodiment, a region, on which the driving wiring 41 which is a metal layer is stacked, in the lower surface of the sealing plate 33 (surface of photosensitive adhesive 43 side) becomes a first region A1 which reflects light (refer to FIG. 5A). Meanwhile, a region deviated from the first region A1 becomes a second region A2 less likely to reflect light than the first region A1. Since such a driving wiring 41 described above is provided in both sides of the resin core bump 40 along the nozzle row direction, the first region A1 and the second region A2 are alternatively arranged in both sides of the resin core bump 40 along the nozzle row direction (that is, to be positioned differently).

As illustrated in FIG. 2 and FIG. 3, such a sealing plate 33 and a pressure chamber forming substrate 29 (in detail, pressure chamber forming substrate 29 on which the vibration plate 31 is stacked) are bonded to each other by the photosensitive adhesive 43 which is cured (that is, has photosensitivity) by being irradiated with light in a state in which the resin core bump 40 is interposed. In the embodiment, as the photosensitive adhesive 43, a photosensitive adhesive having characteristics of both thermoset and photosensitivity is used. In addition, in the embodiment, the photosensitive adhesive 43 is formed in each of both sides of the resin core bump 40 in a direction orthogonal to the nozzle row direction. In other words, at least a part of the photosensitive adhesive 43 is formed on a region deviated from one side (piezoelectric element 32 side) in a direction inside an adjacent surface the sealing plate 33 and the pressure chamber forming substrate 29, and a region deviated from the other side (opposite side of piezoelectric element 32 side) from the connecting region Ac where the electrode layer 40*b* and the lead electrode layer 35 are adjacent to each other. That is, the resin core bump 40 (connecting region Ac) is disposed between the photosensitive adhesive 43 of one side and the photosensitive adhesive 43 of the other side.

Each of the photosensitive adhesives 43 in the embodiment is formed in a band shape along the nozzle row direction in a state of being separated from the resin core bump 40. For this reason, in a plane view, each of the photosensitive adhesives 43 intersects with a plurality of the driving wirings 41 and a plurality of the lead electrode layers 35. In other words, each of the photosensitive adhesives 43 is disposed to overlap the first region A1 and the second region A2 of the sealing plate 33 in an adjacent direction of the sealing plate 33 and the pressure chamber forming substrate 29. In short, in a plane view, the first region A1 in the embodiment becomes a region in which the photosensitive adhesive 43 and the driving wiring 41 which is a metal layer intersect each other. Moreover, as the photosensitive adhesive 43, for example, a resin containing an epoxy resin, an acrylic resin, a phenol resin, a polyimide resin, a silicone resin, a styrene resin, or the like as a main component is preferably used.

The recording head 3 formed as described above introduces ink from the ink cartridge 7 through the liquid introducing passage 18, the common liquid chamber 25, and the individual communicating passage 26 to the pressure chamber 30. In this state, when a driving signal is supplied from the driving circuit 46 through the driving wiring 41, the resin core bump 40, and the lead electrode layer 35 to the piezoelectric element 32, the piezoelectric element 32 is driven, and thus pressure change is generated in the pressure chamber 30. The recording head 3 ejects ink droplets from the nozzle 22 through the nozzle communicating passage 27 using the pressure change.

Figure 4A:
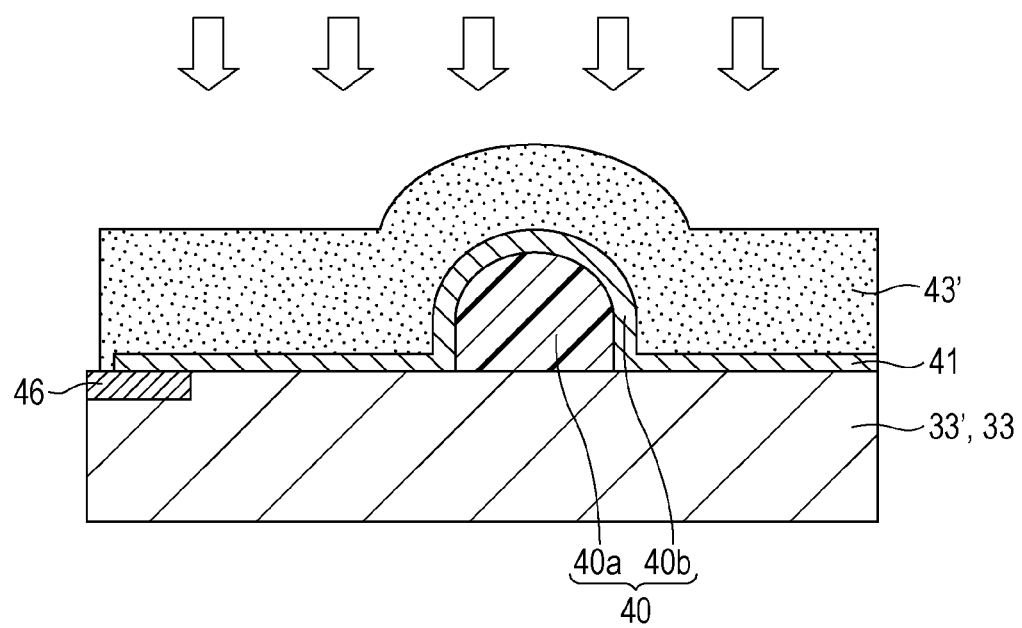
FIGS. 4A and 4B are sectional views of a sealing plate, describing a method of manufacturing a piezoelectric device.
Figure 4B:
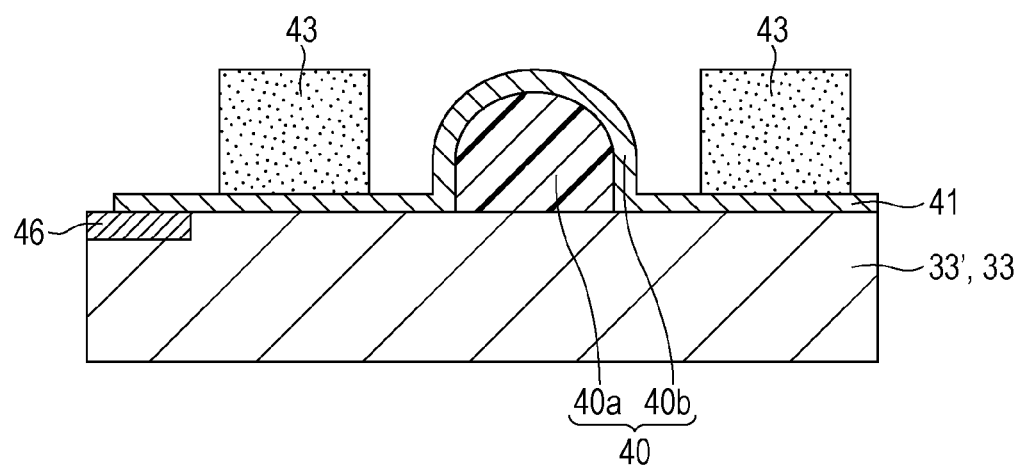
Figure 5A:
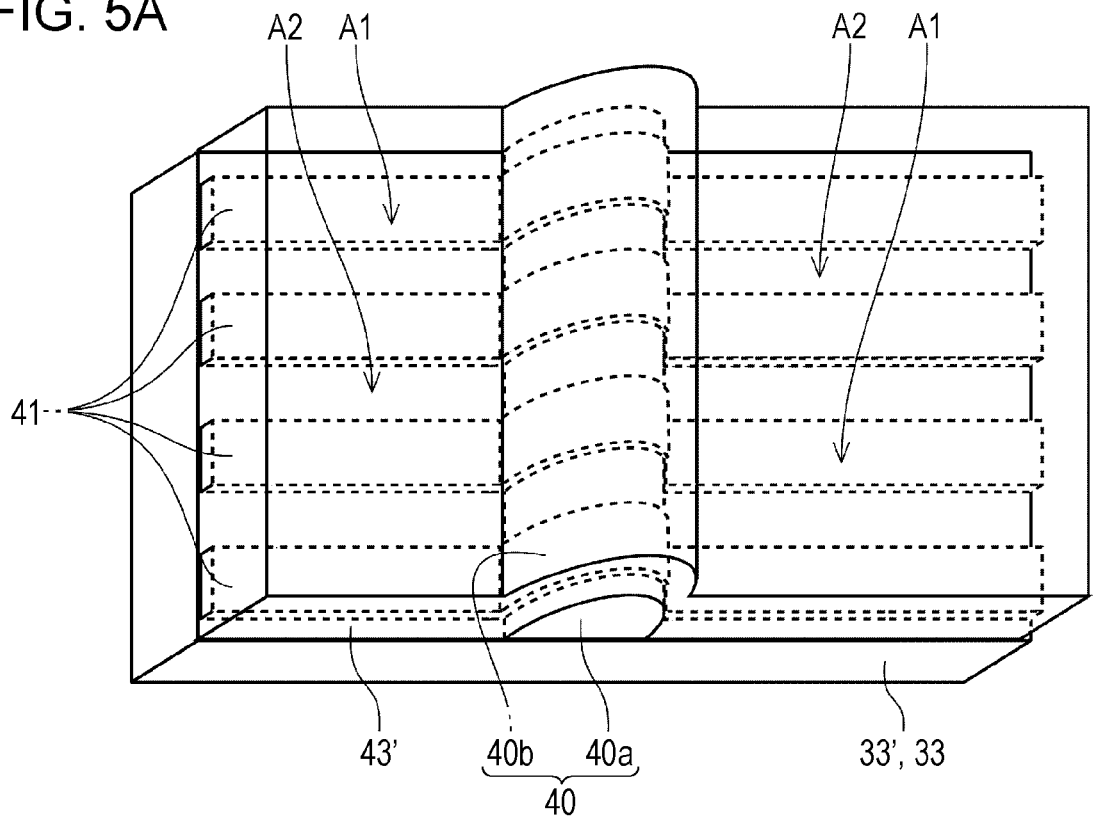
FIGS. 5A and 5B are perspective views of the sealing plate, describing the method of manufacturing the piezoelectric device.
Figure 5B:
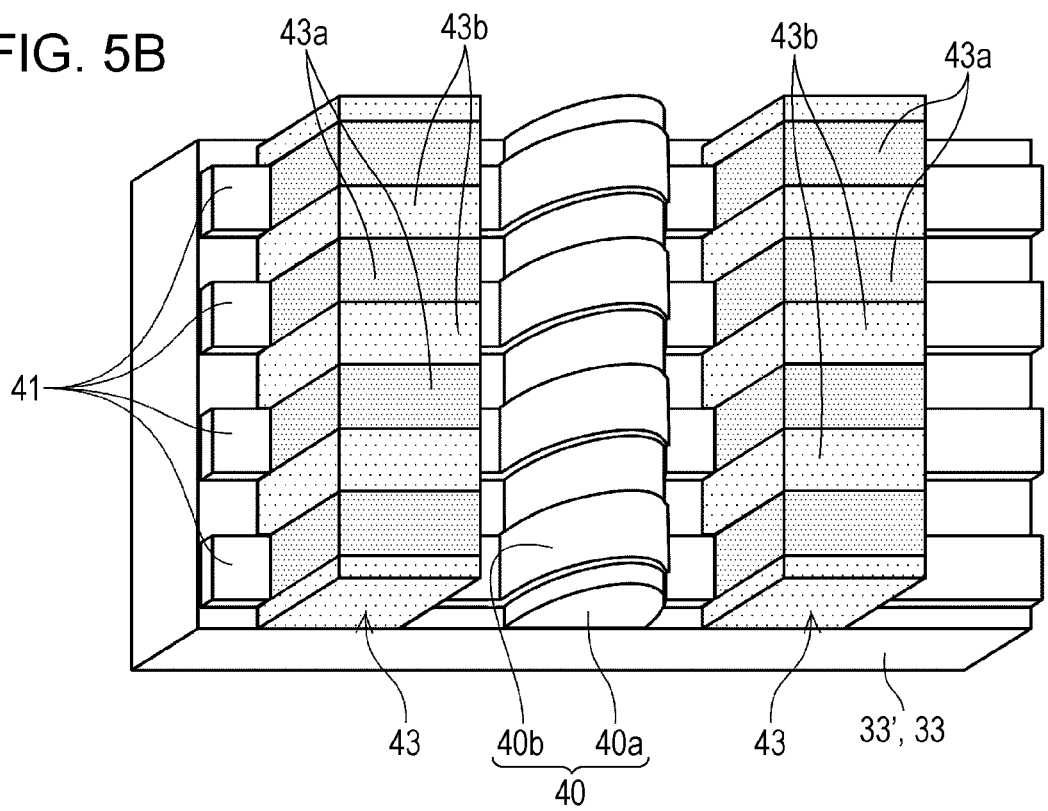

Next, a method of manufacturing the recording head 3, and particularly, a method of manufacturing the piezoelectric device 14 will be described. FIG. 4A is a sectional view taken along a direction orthogonal to the nozzle row direction in a silicon single crystal substrate 33' which becomes the sealing plate 33 in a state in which a photosensitive adhesive layer 43' is applied, and FIG. 4B is a sectional view taken along a direction orthogonal to the nozzle row direction in a silicon single crystal substrate 33' which becomes the sealing plate 33 in a state in which the photosensitive adhesive 43 which is exposed and developed is formed at a predetermined position. In addition, FIG. 5A is a perspective view of the silicon single crystal substrate 33' which becomes the sealing plate 33 in a state in which a photosensitive adhesive layer 43' is applied, and FIG. 5B is a perspective view of the silicon single crystal substrate 33' which becomes the sealing plate 33 in a state in which the photosensitive adhesive 43 which is exposed and developed is formed at a predetermined position. Also, in FIG. 5B, hardness of the photosensitive adhesive 43 is described by a density of dots. That is, a part where dots are dark (color thereof is dark) is hard, and a part where the dots are light (color thereof is light) is soft. In addition, even in FIG. 7B, FIG. 8B, and FIG. 10B to be described later, the hardness thereof is described in the same manner.

First, the vibration plate 31 is stacked on an upper surface (a surface of a side facing the sealing plate 33) in a silicon single crystal substrate which becomes the pressure chamber forming substrate 29. Next, the lower electrode layer 37, the piezoelectric layer 38, the upper electrode layer 39, and the like are sequentially patterned by the semiconductor process in a piezoelectric element forming process, the piezoelectric element 32 is formed, and the lead electrode layer 35 is formed. Meanwhile, first, the driving circuit 46, or the like is formed on the lower surface (a surface of a side facing the pressure chamber forming substrate 29) by the semiconductor process in the silicon single crystal substrate 33' which becomes the sealing plate 33. Next, the resin core bump 40 is formed. Specifically, resin is deposited on the lower surface of the silicon single crystal substrate 33' which becomes the sealing plate 33, after the resin is patterned on a position which becomes the resin portion 40a by etching, or the like, angles thereof are rounded by heating, and thus the resin portion 40a is formed. Accordingly, a surface of an opposite side of the silicon single crystal substrate 33' is curved in an arc shape, and thus the resin portion 40a is formed. After that, in a driving wiring forming process (corresponding to a metal layer forming process in the invention), the driving wiring 41 is formed on the lower surface of the silicon single crystal substrate 33' which becomes the sealing plate 33, and the electrode layer 40b is formed along a surface of the resin portion 40a by the semiconductor process. Accordingly, as illustrated in FIG. 5A, the resin core bump 40 is formed on a surface of a side facing the pressure chamber forming substrate 29 of the silicon single crystal substrate 33' which becomes the sealing plate 33, and the first region A1 where light is likely to be reflected and the second region A2 where light is less likely to be reflected than in the first region A1 are formed.

If the first region A1 and the second region A2 are formed on the silicon single crystal substrate 33' which becomes the sealing plate 33, in a photosensitive adhesive layer forming process, as illustrated in FIG. 4A and FIG. 5A, the photosensitive adhesive layer 43' is formed on a surface of a side where the resin core bump 40 is formed. For example, the photosensitive adhesive of a liquid type is applied onto the entire surface of the sealing plate 33 using a spin coater, or the like, and the photosensitive adhesive layer 43' which is cured at a certain degree of hardness by heating is formed. Next, in an exposing and developing process, for example, light (refer to arrow illustrated in FIG. 4A) such as ultra-violet rays, or the like is shined on the photosensitive adhesive layer 43', and as illustrated in FIG. 4B and FIG. 5B, the photosensitive adhesives 43 having different hardness are formed respectively on a different position in both sides of the resin core bump 40, and the other photosensitive adhesive layers 43' are removed. Specifically, through a photomask in which a predetermined position is opened, light is applied onto the photosensitive adhesive layer 43'. At this time, since the light incident on the photosensitive adhesive layer 43' in the first region A1 is reflected in the driving wiring 41, at the time of the reflected light reaching the photosensitive adhesive 43a in the first region A1 again, a curing reaction of the photosensitive adhesive 43a in the first region A1 is progressed (part having dark color in FIG. 5B). Meanwhile, since the light incident on the photosensitive adhesive layer 43' in the second region A2 has a small reflectance compared to the driving wiring 41, the curing reaction is less likely to be progressed in the photosensitive adhesive 43b in the second region A2 compared to the photosensitive adhesive 43a in the first region A1 (part having light color in FIG. 5B). As a result, the photosensitive adhesive 43a in the first region A1 is harder than the photosensitive adhesive 43b in the second region A2 deviated from the first region A1. Also, a part where light is not applied in the photosensitive adhesive layer 43' is removed by a solvent (developer).

If the photosensitive adhesive 43 is formed, in the substrate bonding process, a silicon single crystal substrate which becomes the sealing plate 33 and a silicon single crystal substrate which becomes the pressure chamber forming substrate 29 are bonded to each other. Specifically, when any one of the silicon single crystal substrates is relatively moved toward the other silicon single crystal substrate side, both the silicon single crystal substrates are bonded to each other with the photosensitive adhesive 43 pinched therebetween. In this state, against a restoring force of elasticity of the resin core bump 40, both the silicon single crystal substrates are pressed from a vertical direction. Accordingly, the resin core bump 40 is crushed, and is capable of reliably conducting to the lead electrode layer 35 of the pressure chamber forming substrate 29 side. Also, the substrates are heated up to a curing temperature of the photosensitive adhesive 43 while being pressed. As a result, the resin core bump 40 is crushed in a state of being elastically deformed, and curing is performed when the photosensitive adhesive 43 is further cured, and thus both the silicon single crystal substrates are bonded with each other. Moreover, after the curing, the hardness of the photosensitive adhesive 43 in the first region A1 and the photosensitive adhesive 43 in the second region A2 are substantially the same as each other.

Here, when further curing the photosensitive adhesive 43a formed on the first region A1 than the photosensitive adhesive 43b formed on the second region A2, and both the silicon single crystal substrates are bonded to each other in a state in which the electrode layer 40b and the lead electrode layer 35 are connected (conducted) by applying pressure, the pressure can be dispersed in the connecting region Ac where the electrode layer 40b and the lead electrode layer 35 are adjacent to each other, and the photosensitive adhesive 43a formed on the first region A1. As a result, by the pressure applied to the connecting region Ac, disconnection of the electrode layer 40b because the resin portion 40a is elastically deformed excessively can be suppressed. Particularly, in the embodiment, the photosensitive adhesive 43 is formed on both sides of the connecting region Ac, and facing substrates can be supported by the photosensitive adhesive 43 formed on both sides of the connecting region Ac. As a result, disconnection of the electrode layer 40b can be further suppressed. In addition, since the photosensitive adhesive 43b formed on the second region A2 is softer than the photosensitive adhesive 43a formed on the first region A1, adhesion with respect to the silicon single crystal substrate which becomes the facing pressure chamber forming substrate 29, that is, an adhesive force is increased. Accordingly, a bonding force between the silicon single crystal substrate which becomes the sealing plate 33 and the silicon single crystal substrate which becomes the pressure chamber forming substrate 29 can be increased.

Also, if both the silicon single crystal substrates are bonded to each other, the silicon single crystal substrate of the pressure chamber forming substrate 29 side is grinded from the lower surface side (opposite side of sealing plate 33), the silicon single crystal substrate of the pressure chamber forming substrate 29 side is made thin. After that, the pressure chamber 30 is formed on the silicon single crystal substrate of the thin pressure chamber forming substrate 29 side by etching. That is, the pressure chamber 30 is formed in a state in which the vibration plate 31 is left on the upper surface side, when the silicon single crystal substrate of the pressure chamber forming substrate 29 side is recessed from the lower surface side by etching. Accordingly, the piezoelectric device 14 described above is manufactured.

The piezoelectric device 14 manufactured in such a manner is determined to be positioned and fixed on the flow passage unit 15 (communication substrate 24) using an adhesive, or the like. Then, the recording head 3 is manufactured by bonding the head case 16 and the flow passage unit 15, in a state in which the piezoelectric device 14 is accommodated in the accommodation space 17 of the head case 16.

Accordingly, when the first region A1 where light is likely to be reflected to the silicon single crystal substrate 33' which becomes the sealing plate 33 is formed, and the photosensitive adhesive 43 is patterned by applying the light in the exposing and developing process, the photosensitive adhesive 43a formed on the first region A1 can be harder than the photosensitive adhesive 43b formed on the second region A2 deviated from the first region A1. Accordingly, in a state before curing, the photosensitive adhesive 43 having different hardness can be easily made, and a bonding force between the sealing plate 33 and the pressure chamber forming substrate 29 can be increased while suppressing disconnection of the electrode layer 40b. In addition, the first region A1 is formed of the driving wiring 41 made of a metal, and thus the first region A1 where the light is likely to be reflected can be easily formed. As a result, the piezoelectric device 14 is easily manufactured.

In the meantime, in a method of manufacturing the piezoelectric device 14 in a first embodiment described above, the first region A1 and the second region A2 are formed on the sealing plate 33 side, and the sealing plate 33 and the pressure chamber forming substrate 29 are bonded to each other by applying the photosensitive adhesive 43 onto the sealing plate 33 side; however, it is not limited thereto. For example, as illustrated in FIG. 6A to FIG. 7B, in a method of manufacturing the piezoelectric device 14 in a second embodiment, when the sealing plate 33 and the pressure chamber forming substrate 29 are bonded to each other by applying the photosensitive adhesive 43 onto the pressure chamber forming substrate 29 side, the piezoelectric device 14 is manufactured.

To describe more specifically, in the method of the second embodiment, first, after the driving circuit 46, or the like is formed on the lower surface of the silicon single crystal substrate which becomes the sealing plate 33 in the same method as that of the first embodiment, the resin core bump 40 is formed. Next, in the driving wiring forming process, by the semiconductor process, the driving wiring 41 is formed on the lower surface of the silicon single crystal substrate which becomes the sealing plate 33, and the electrode layer 40b is formed along a surface of the resin portion 40a. Meanwhile, in the silicon single crystal substrate 29' which becomes the pressure chamber forming substrate 29, the vibration plate 31 is stacked on the upper surface thereof in the same method as that of the first embodiment. Next, in the piezoelectric element forming process, by the semiconductor process, the lower electrode layer 37, the piezoelectric layer 38, the upper electrode layer 39, and the like are sequentially patterned, the piezoelectric element 32 is formed, and the lead electrode layer 35 is formed (refer to FIGS. 6A and 6B, or the like). Accordingly, as illustrated in FIG. 7A, in a region deviated from the piezoelectric element 32 (that is, non driving region), the piezoelectric layer 38 successively formed throughout a plurality of the piezoelectric elements 32 is formed, and the lead electrode layer 35 made of a metal layer having higher reflectance with respect to light than the piezoelectric layer 38 is formed on the piezoelectric layer 38. For this reason, in the embodiment, a region on which the lead electrode layer 35 is stacked becomes the first region A1 where the light is easily reflected, and a region deviated from the lead electrode layer 35, where the piezoelectric layer 38 is exposed becomes the second region A2 where the light is less likely to be reflected than in the first region A1. Also, a process of forming the lead electrode layer 35 included in the piezoelectric element forming process corresponds to a metal layer forming process in the invention.

Figure 6A:
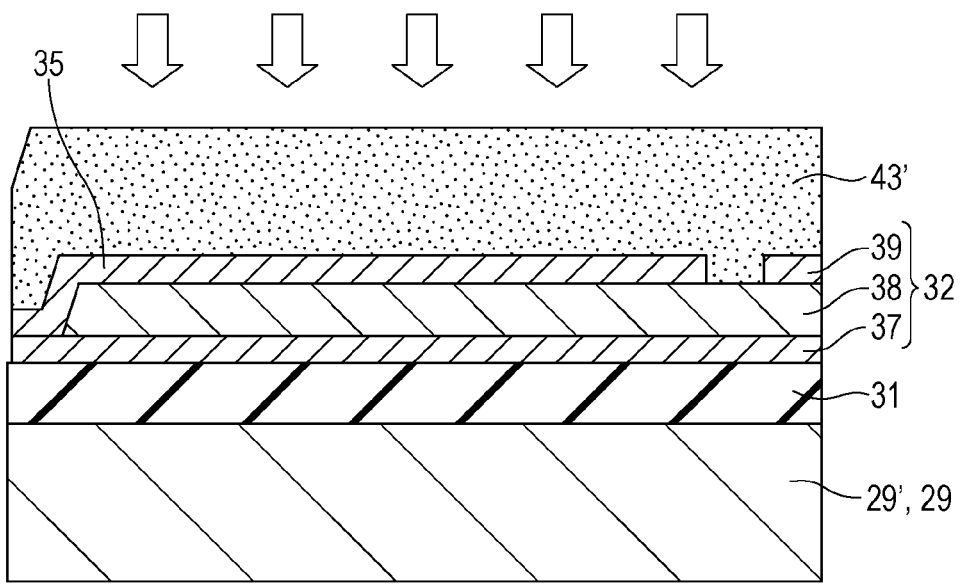
FIGS. 6A and 6B are sectional views of a pressure chamber forming substrate, describing a method of manufacturing a piezoelectric device in a second embodiment.
Figure 6B:
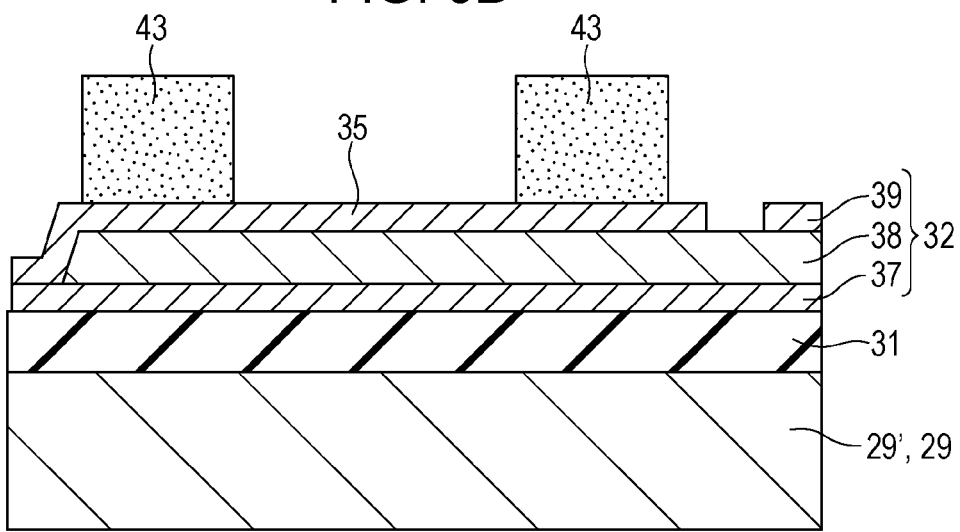
Figure 7A:
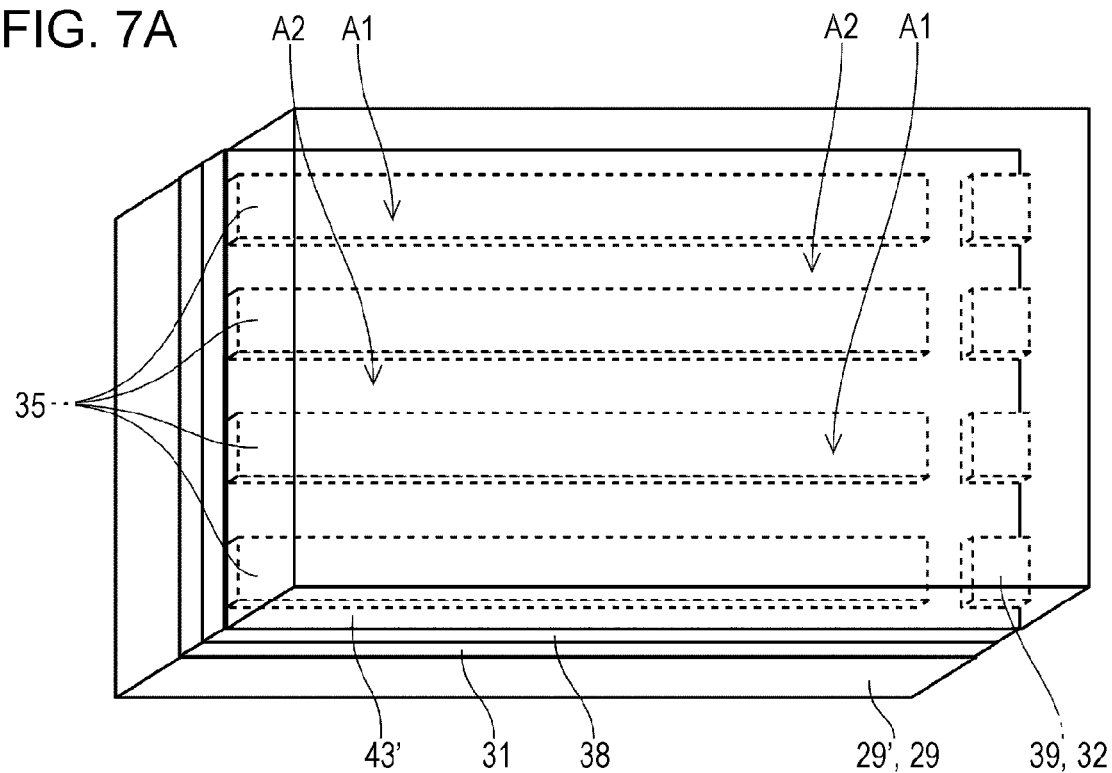
FIGS. 7A and 7B are perspective views of the pressure chamber forming substrate, describing the method of manufacturing the piezoelectric device in the second embodiment.
Figure 7B:
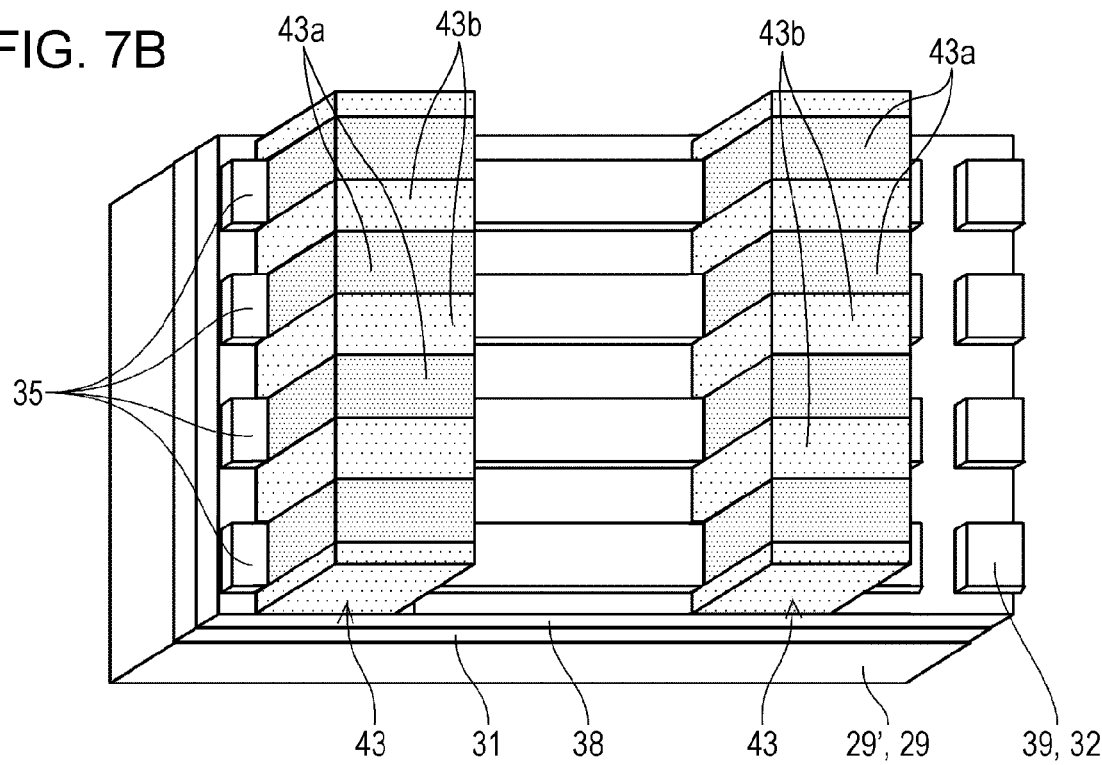

If the first region A1 and the second region A2 are formed on the silicon single crystal substrate 29' which becomes the pressure chamber forming substrate 29, in the photosensitive adhesive layer forming process, as illustrated in FIG. 6A and FIG. 7A, the photosensitive adhesive layer 43' is formed on a surface of a side where the lead electrode layer 35, or the like is formed. For example, the photosensitive adhesive of a liquid type is applied to the entire surface of the pressure chamber forming substrate 29 using a spin coater, or the like, and the photosensitive adhesive layer 43' which is cured at a certain degree of hardness by heating is formed. Next, in the exposing and developing process, light is applied onto the photosensitive adhesive layer 43' (refer to arrow illustrated in FIG. 6A), and as illustrated in FIG. 6B and FIG. 7B, the photosensitive adhesive 43 having different hardness is formed respectively on a different position in a region corresponding to both sides of the resin core bump 40, and the other photosensitive adhesive layer 43' is removed. Specifically, through a photomask in which a predetermined position is opened, light is applied onto the photosensitive adhesive layer 43'. At this time, since the light incident on the photosensitive adhesive layer 43' in the first region A1 is reflected in the lead electrode layer 35, at the time of the reflected light reaching the photosensitive adhesive 43a in the first region A1 again, a curing reaction of the photosensitive adhesive 43a in the first region A1 is progressed (part having dark color in FIG. 7B). Meanwhile, since the light incident on the photosensitive adhesive layer 43' in the second region A2 has a small reflectance compared to the lead electrode layer 35, the curing reaction is less likely to be progressed in the photosensitive adhesive 43b in the second region A2 compared to the photosensitive adhesive 43a in the first region A1 (part having light color in FIG. 7B). As a result, the photosensitive adhesive 43a in the first region A1 is harder than the photosensitive adhesive 43b in the second region A2 deviated from the first region A1. Also, a part where light is not applied in the photosensitive adhesive layer 43' is removed by a solvent (developer).

If the photosensitive adhesive 43 is formed, in the same method as that of the first embodiment, in the substrate bonding process, the photosensitive adhesive 43 is cured in a state of being conducted to the electrode layer 40b and the lead electrode layer 35 by pressing, and the silicon single crystal substrate which becomes the sealing plate 33 and the silicon single crystal substrate which becomes the pressure chamber forming substrate 29 are bonded to each other. If both the silicon single crystal substrates are bonded to each other, the silicon single crystal substrate of the pressure chamber forming substrate 29 side is grinded from the lower surface side (opposite side of sealing plate 33), the silicon single crystal substrate of the pressure chamber forming substrate 29 side is made thin. After that, when the pressure chamber 30 is formed on the silicon single crystal substrate of the thin pressure chamber forming substrate 29 side by etching, the piezoelectric device 14 is manufactured. Also, the other configurations and manufacturing methods are the same as that of the first embodiment, and thus description thereof will be omitted.

As seen from the above, even in the embodiment, when the first region A1 where light is likely to be reflected to the silicon single crystal substrate 29' which becomes the pressure chamber forming substrate 29 is formed, and the photosensitive adhesive 43 is patterned by applying the light in the exposing and developing process, the photosensitive adhesive 43a formed on the first region A1 can be harder than the photosensitive adhesive 43b formed on the second region A2 deviated from the first region A1. Accordingly, in a state before curing, the photosensitive adhesive 43 having different hardness can be easily made, and a bonding force between the sealing plate 33 and the pressure chamber forming substrate 29 can be increased while suppressing disconnection of the electrode layer 40b. In addition, the first region A1 is formed of the lead electrode layer 35 made of a metal, and thus the first region A1 where the light is likely to be reflected can be easily formed. As a result, the piezoelectric device 14 is easily manufactured.

In addition, in a method of manufacturing the piezoelectric device 14 in the first embodiment and the second embodiment, a metal layer (driving wiring 41 or lead electrode layer 35) is formed on the first region A1, and light is likely to be reflected more than the second region A2; however, it is not limited. When a layer (film) which suppresses light reflection or a layer (film) which absorbs the light is formed on the second region A2, the first region A1 may easily reflect the light more than the second region A2. In addition, a metal layer is formed on the first region A1, and the layer (film) which suppresses light reflection or the layer (film) which absorbs the light may be formed on the second region A2. For example, in a method of manufacturing the piezoelectric device 14 in a third embodiment illustrated in FIGS. 8A and 8B, a light absorbing film 44 for easily absorbing light in a region between the adjacent lead electrode layers 35 is formed.

Figure 8A:
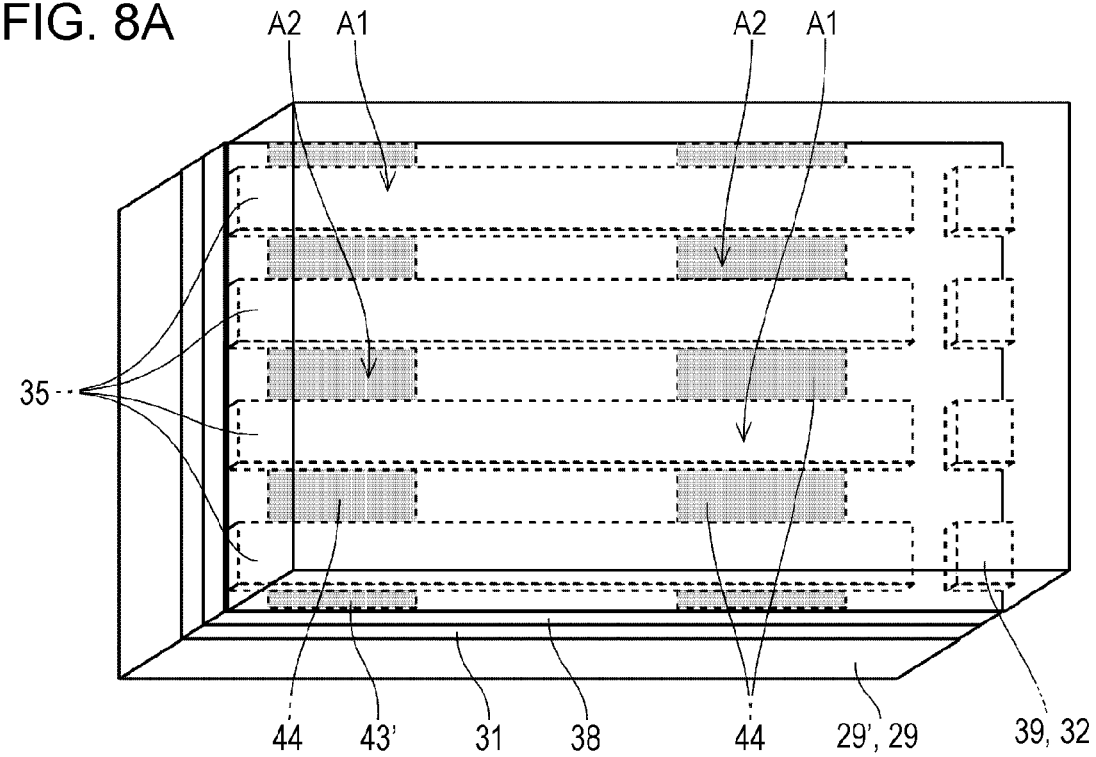
FIGS. 8A and 8B are perspective views of a pressure chamber forming substrate, describing a method of manufacturing a piezoelectric device in a third embodiment.

To describe more specifically, in the method of the third embodiment, the vibration plate 31 is stacked on the upper surface of the silicon single crystal substrate 29' which becomes the pressure chamber forming substrate 29 in the same method as that of the second embodiment. Next, in the piezoelectric element forming process, by the semiconductor process, the lower electrode layer 37, the piezoelectric layer 38, the upper electrode layer 39, and the like are sequentially patterned, the piezoelectric element 32 is formed, and the lead electrode layer 35 is formed. After that, in the light absorbing film forming process, as illustrated in FIG. 8A, the light absorbing film 44 is formed on the piezoelectric layer 38 between the adjacent lead electrode layers 35. Also, as the light absorbing film 44, a resin having an insulation property, such as polyimide including a black pigment, such as carbon is used. Accordingly, as illustrated in FIG. 8A, the first region A1 made of the lead electrode layer 35 having high reflectance with respect to light, and the second region A2 made of the light absorbing film 44 where the light is easily absorbed are formed on a region where the photosensitive adhesive 43 is formed.

Figure 8B:
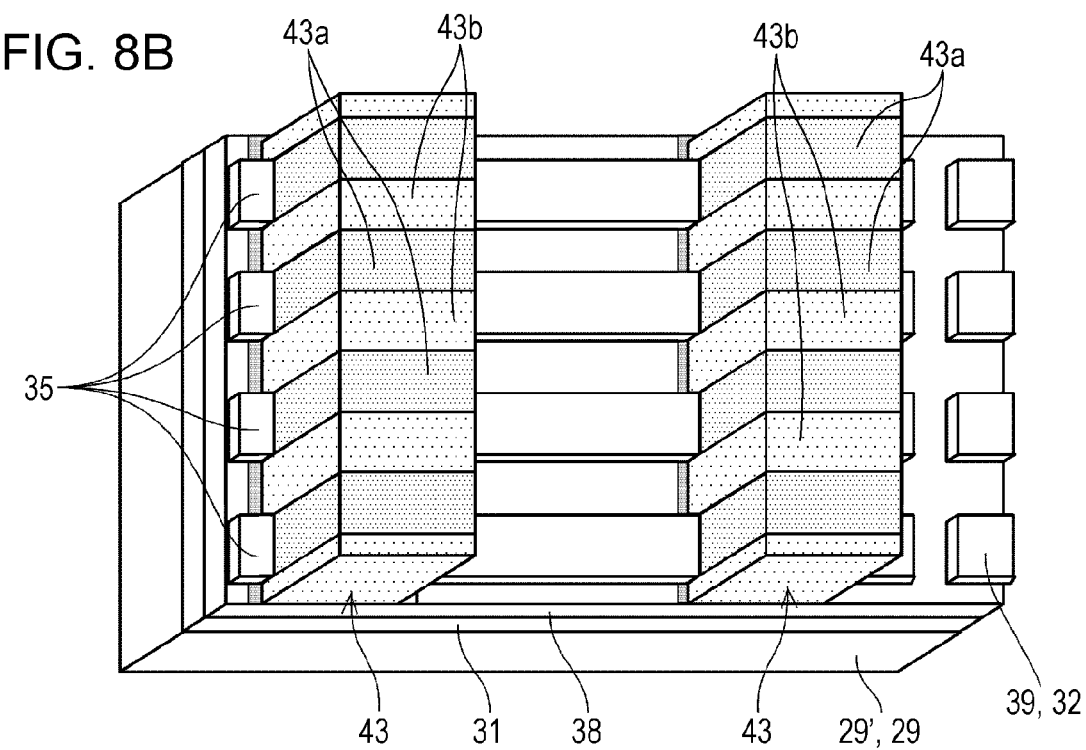

The light absorbing film 44 is formed on the second region A2 as described above, in the exposing and developing process after forming the photosensitive adhesive layer 43', as illustrated in FIG. 8B, and the photosensitive adhesive 43 which has a higher hardness difference can be formed on a different respective position. That is, the photosensitive adhesive 43b in the second region A2 can be further softened than the photosensitive adhesive 43a in the first region A1. Accordingly, a bonding force by the photosensitive adhesive 43b formed on the second region A2 can be further increased, an adhesion force of the silicon single crystal substrate which becomes the sealing plate 33 and the silicon single crystal substrate which becomes the pressure chamber forming substrate 29 can be further increased. Moreover, the other configurations and manufacturing methods are the same as that of the second embodiment, and thus description thereof is omitted.

Further, in each embodiment described above, a region in which the light is reflected by the driving wiring 41 or the lead electrode layer 35, which is a metal layer, is set to the first region A1; however, it is not limited thereto. Without using a wiring of the driving wiring 41, the lead electrode layer 35, or the like, a metal layer for reflecting light may be separately formed. For example, in a fourth embodiment illustrated in FIG. 9 to FIG. 10B, metal layers for reflecting 47 are formed on a region overlapping the photosensitive adhesive 43 which is formed on one side (piezoelectric element 32 side) of the resin core bump 40 in a region overlapping the photosensitive adhesive 43 on the pressure chamber forming substrate 29 side. In the embodiment, the region on which the metal layers for reflecting 47 are formed and the region on which the lead electrode layer 35 is formed become the first region A1. Moreover, the piezoelectric device 14 in the embodiment is formed when the pressure chamber 30 extends in the longitudinal direction of the piezoelectric element 32, and overlaps the photosensitive adhesive 43 formed on one side (piezoelectric element 32 side) in the thickness direction (bonding direction of the sealing plate 33 and the pressure chamber forming substrate 29). In addition, in the embodiment, a part overlapping the photosensitive adhesive 43 of the pressure chamber 30 in the thickness direction corresponds to a space in the invention.

Figure 9:
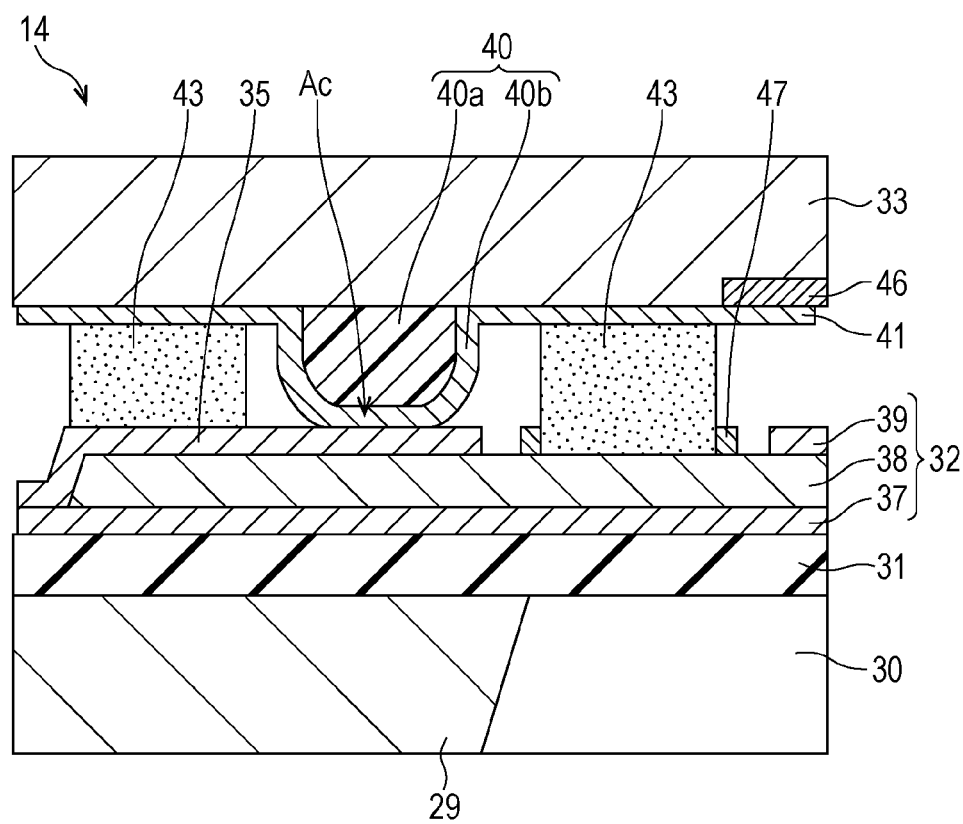
FIG. 9 is an enlarged sectional view of a main part of a recording head in a fourth embodiment.

To describe more specifically, as illustrated in FIG. 9, the lead electrode layer 35 in the embodiment extends from a region conducting to the lower electrode layer 37 in an end portion of the vibration plate 31 to a position the pressure chamber 30 does not overlap in the thickness direction. For this reason, the connecting region Ac in which the electrode layer 40b of the resin core bump 40 and the lead electrode layer 35 are adjacent to each other becomes a position where the pressure chamber 30 does not overlap in the thickness direction. The photosensitive adhesive 43 formed on both sides of the resin core bump 40 extends in the nozzle row direction in the same manner as that of each embodiment described above. That is, the photosensitive adhesive 43 formed on the other side (opposite side of piezoelectric element 32) is formed so as to intersect with a plurality of the lead electrode layers 35, in the same manner as that of each embodiment described above, in a plane view. Meanwhile, the photosensitive adhesive 43 formed on one side of the resin core bump 40 is formed throughout a plurality of the pressure chambers 30 in a region between the lead electrode layer 35 and the piezoelectric element 32 (upper electrode layer 39). Also, on the piezoelectric layer 38 of the region where the photosensitive adhesive 43 is formed on one side of the resin core bump 40, each metal layer for reflecting 47 made of a metal the same as that of the lead electrode layer 35 is formed, and the metal layer for reflecting 47 is formed so as not to conduct to the lead electrode layer 35 and the upper electrode layer 39. In addition, as illustrated in a sectional view taken along the nozzle row direction illustrated in FIG. 10A, the metal layer for reflecting 47 is formed in an island shape on a region corresponding to a region between the adjacent pressure chambers 30. That is, the metal layers for reflecting 47 are formed along the nozzle row direction at a pitch the same as that of the pressure chambers 30 which are formed in parallel. Also, a region where the metal layer for reflecting 47 is formed becomes the first region A1, and a region corresponding to the pressure chamber 30 becomes the second region A2.

Next, a method of manufacturing the piezoelectric device 14 in the fourth embodiment configured as above will be described. Particularly, formation of the photosensitive adhesive 43 formed on one side of the resin core bump 40 will be described. First, in the silicon single crystal substrate which becomes the sealing plate 33, the driving circuit 46, the resin core bump 40, and the like are formed on the lower surface by the same method as that of each embodiment described above. Meanwhile, in the silicon single crystal substrate 29' which becomes the pressure chamber forming substrate 29, the vibration plate 31 is stacked on the upper surface by the same method as that of each embodiment described above. Next, in the piezoelectric element forming process, the lower electrode layer 37, the piezoelectric layer 38, the upper electrode layer 39, and the like are sequentially patterned, the piezoelectric element 32 is formed, and the lead electrode layer 35 and the metal layer for reflecting 47 are formed by the semiconductor process. Also, after the silicon single crystal substrate 29' of the pressure chamber forming substrate 29 side is grinded from the lower surface side (opposite side of sealing plate 33), the pressure chamber 30 is formed on the silicon single crystal substrate 29' of the thin pressure chamber forming substrate 29 side.

Figure 10A:
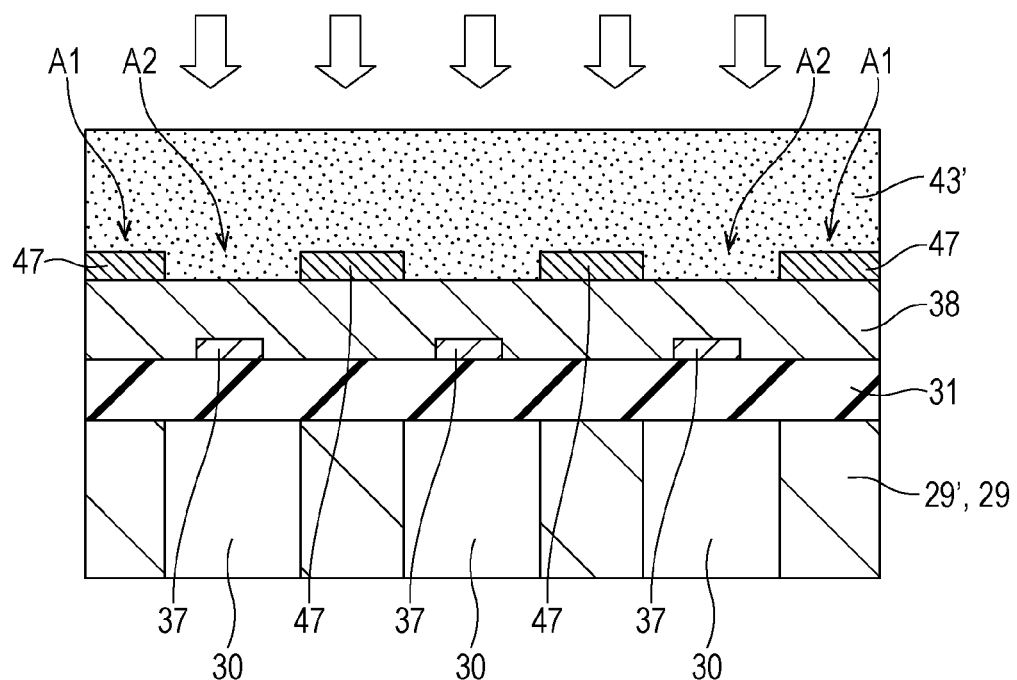
FIGS. 10A and 10B are sectional views of the pressure chamber forming substrate, describing a method of manufacturing the piezoelectric device in the fourth embodiment.
Figure 10B:
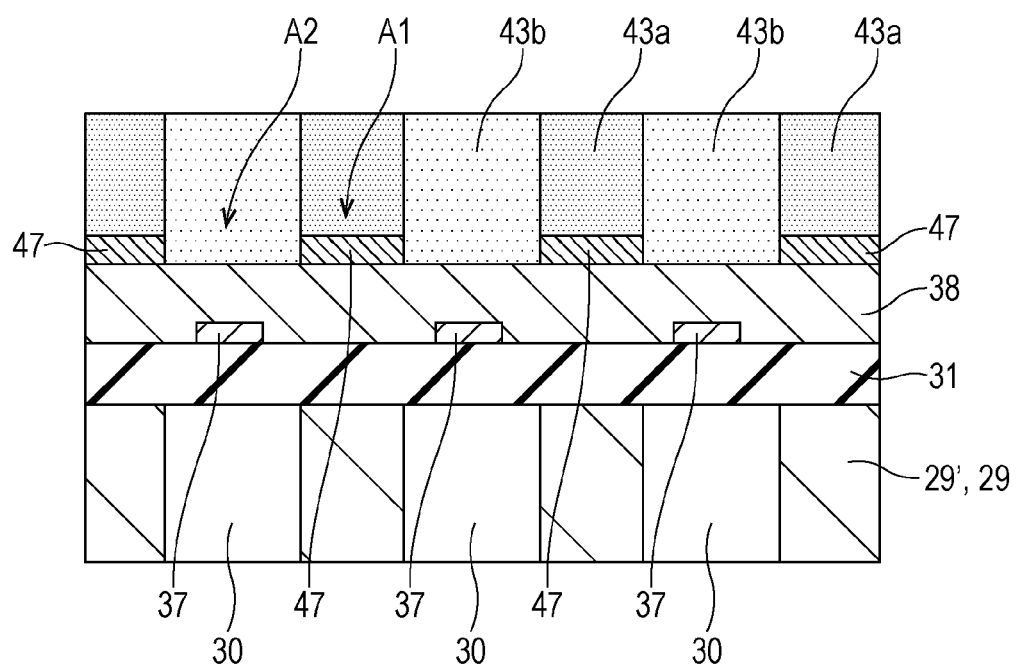

If the pressure chamber 30 is made on the silicon single crystal substrate 29' which becomes the pressure chamber forming substrate 29, in the photosensitive adhesive layer forming process, as illustrated in FIG. 10A, in the same manner as that of each embodiment described above, the photosensitive adhesive layer 43' is formed on a surface of a side where the metal layer for reflecting 47, or the like is formed. Next, in the exposing and developing process, light is applied onto the photosensitive adhesive layer 43' (refer to arrow illustrated in FIG. 10A), and as illustrated in FIG. 10B, the photosensitive adhesive 43 having different hardness is formed respectively on a different position in a region corresponding to both sides of the resin core bump 40, and the other photosensitive adhesive layer 43' is removed. At this time, in the first region A1 where the lead electrode layer 35 and the metal layer for reflecting 47 are formed, a lot of light shines on the photosensitive adhesive layer 43', and thus the curing reaction of the photosensitive adhesive 43*a* is progressed (part having dark color in FIG. 10B). Meanwhile, in the second region A2 deviated from the first region A1, light is less likely to be incident on the photosensitive adhesive layer 43' further than the first region A1, and the curing reaction of the photosensitive adhesive 43*b* is less likely to be progressed (part having light color in FIG. 10B). As a result, the photosensitive adhesive 43*a* in the first region A1 becomes harder than the photosensitive adhesive 43*b* in the second region A2 deviated from the first region A1. That is, as illustrated in FIG. 10B, the photosensitive adhesive 43*b* of a region overlapping in the thickness direction on the pressure chamber 30 is relatively softened.

As seen from the above, even in the embodiment, the photosensitive adhesive 43*a* formed on the first region A1 is harder than the photosensitive adhesive 43*b* formed on the second region A2, and when both the silicon single crystal substrates are bonded to each other in a state in which the electrode layer 40*b* and the lead electrode layer 35 are conducted to each other by pressing, disconnection of the electrode layer 40*b* due to the pressure can be further suppressed. In addition, since the second region A2, that is, the photosensitive adhesive 43*b* formed on a region corresponding to the pressure chamber 30 becomes softer than the photosensitive adhesive 43*a* formed on the first region A1, at the time of bonding both the silicon single crystal substrates, pressure applied to a part (vibration plate 31) corresponding to the pressure chamber 30 can be weakened. As a result, destroying of the pressure chamber 30 can be suppressed. Further, a sticking force to the silicon single crystal substrate which becomes the facing sealing plate 33, that is, an adhesion force is increased, and a bonding force between the silicon single crystal substrate which becomes the sealing plate 33 and the silicon single crystal substrate which becomes the pressure chamber forming substrate 29 can be increased. Moreover, the other configurations and manufacturing methods are the same as that of the second embodiment, and thus description thereof is omitted.

In the meantime, in the embodiment described above, the resin core bump 40 is formed on the sealing plate 33 side; however, it is not limited thereto. For example, the resin core bump may be formed on the pressure chamber forming substrate side. In this case, the pressure chamber forming substrate and the vibration plate stacked on the substrate become the first substrate in the invention, and the sealing plate becomes the second substrate in the invention. In addition, in this case, a part of the lead electrode layer is formed to cover the resin portion, and becomes the first electrode layer in the invention, and in the meantime, the driving wiring becomes the second electrode layer conducting to the first electrode layer. Also, even in this case, the photosensitive adhesive can be formed on any one of the pressure chamber forming substrate side and the sealing plate side.

In addition, in each embodiment described above, as a method of forming the photosensitive adhesives 43 having different hardness, a method, in which light reflectance of the first region A1 and the second region A2 are respectively set to be different and an exposing amount of each photosensitive adhesive 43 is provided differently, is adopted; however, it is not limited thereto. For example, a method, in which a part where light is likely to be transmitted and a part where light is less likely to be transmitted are formed on a photomask used at the time of exposing, and an exposing amount of each the photosensitive adhesive is provided differently, can be adopted. In addition, a method in which the first region A1 and the second region A2 are provided as in the embodiment described above, a method in which the exposing amount of each photosensitive adhesive is provided differently by the part where light is likely to be transmitted and the part where light is less likely to be transmitted of the photomask, can be used in combination. Other than the method, as a method in which the exposing amount of each photosensitive adhesive is provided differently, a method, in which exposing is carried out once on a part where hardness of the photosensitive adhesive needs to be suppressed, and exposing is carried out in plural on a part where hardness of the photosensitive adhesive needs to be hard is adopted. In this way, without providing a metal layer, or the like, an exposing amount can be provided differently on an arbitrary region.

Further, a surface of a side where the first region is formed is grinded in the silicon single crystal substrate and becomes the pressure chamber forming substrate or the sealing plate, and can be processed so as to become a more flat surface. Consequently, a surface of a metal layer (lead electrode layer, driving wiring, metal layer for reflecting, and the like) stacked on the silicon single crystal substrate becomes more flat, and thus light is further likely to be reflected.

Also, in the above description, as a type of the bonded structure, the piezoelectric device 14 built into the recording head 3 is described as an example; however, the invention can be applied to a bonded structure which is provided on other electronic devices, if a substrate where the resin core bump is formed and a substrate where an electrode conducting to the resin core bump is formed are bonded to each other. In addition, as the piezoelectric device, other than a device built into the recording head, for example, a piezoelectric device in which the piezoelectric element functions as a sensor can be also used. Further, as the liquid ejecting head, the invention can be applied to, for example, a color material ejecting head used for manufacturing a color filter such as a liquid crystal display, an electrode material ejecting head used for forming an electrode of an organic electro luminescence (EL) display, an field emission display (FED), or the like, and a bio organic material ejecting head, used for manufacturing a biochip (biochemical element), or the like.

What is claimed is:

1. A bonded structure comprising:
a first substrate in which a resin portion made of an elastic member protrudes on one surface and a first electrode layer is formed to cover at least a part of the resin portion and
a second substrate in which a second electrode layer electrically connected to the first electrode layer is formed on a surface facing the first substrate, the first substrate and the second substrate being bonded to each other in a state in which a photosensitive adhesive is interposed therebetween,
wherein, in a surface of one of the first substrate and the second substrate on the photosensitive adhesive side, a first region reflecting light and a second region less likely to reflect light than the first region are provided in positions different from each other on a region overlapping the photosensitive adhesive in a substrate bonding direction.

2. The bonded structure according to claim 1,
wherein at least a part of the photosensitive adhesive is formed on a region deviated to one side in an in-bonding-surface direction from a connection region where the first electrode layer and the second electrode layer abut onto each other and a region deviated to the other side from the connection region, and the connection region is disposed between the photosensitive adhesives on the both sides.

3. A piezoelectric device comprising:
the bonded structure according to claim 2 and
a piezoelectric element that is formed on one of the first substrate and the second substrate and is electrically connected to the first electrode layer and the second electrode layer.

4. A liquid ejecting head comprising:
the piezoelectric device according to claim 3;
a pressure chamber of which the volume changes due to deformation of the piezoelectric element; and
a nozzle that communicates with the pressure chamber.

5. The bonded structure according to claim 1,
wherein the first region is a region where the photosensitive adhesive and a metal layer intersect each other.

6. A piezoelectric device comprising:
the bonded structure according to claim 5 and
a piezoelectric element that is formed on one of the first substrate and the second substrate and is electrically connected to the first electrode layer and the second electrode layer.

7. A liquid ejecting head comprising:
the piezoelectric device according to claim 6;
a pressure chamber of which the volume changes due to deformation of the piezoelectric element; and
a nozzle that communicates with the pressure chamber.

8. The bonded structure according to claim 1,
wherein a space formed by recessing a surface on the opposite side to the photosensitive adhesive side is provided on a region overlapping at least a part of the photosensitive adhesive in the substrate bonding direction in one of the first substrate and the second substrate and
wherein the second region is a region corresponding to the space of the one substrate.

9. A piezoelectric device comprising:
the bonded structure according to claim 8 and
a piezoelectric element that is formed on one of the first substrate and the second substrate and is electrically connected to the first electrode layer and the second electrode layer.

10. A liquid ejecting head comprising:
the piezoelectric device according to claim 9;
a pressure chamber of which the volume changes due to deformation of the piezoelectric element; and
a nozzle that communicates with the pressure chamber.

11. A piezoelectric device comprising:
the bonded structure according to claim 1 and
a piezoelectric element that is formed on one of the first substrate and the second substrate and is electrically connected to the first electrode layer and the second electrode layer.

12. A liquid ejecting head comprising:
the piezoelectric device according to claim 11;
a pressure chamber of which the volume changes due to deformation of the piezoelectric element; and
a nozzle that communicates with the pressure chamber.

13. A method of manufacturing a bonded structure including a first substrate in which a resin portion made of an elastic member protrudes on one surface and a first electrode layer is formed to cover at least a part of the resin portion and a second substrate in which a second electrode layer electrically connected to the first electrode layer is formed on a surface facing the first substrate, the first substrate and the second substrate being bonded to each other in a state in which a photosensitive adhesive is interposed therebetween, the method comprising:
- forming a photosensitive adhesive layer on one of the first substrate and the second substrate;
- applying light to the photosensitive adhesive layer on the one substrate to form the photosensitive adhesives having different hardness in positions different from each other and removing the other photosensitive adhesive; and
- bonding the first substrate and the second substrate to each other by further curing the photosensitive adhesive in a state in which the first electrode layer and the second electrode layer are connected to each other.

14. The method of manufacturing a bonded structure according to claim 13, further comprising:
- forming a metal layer on a first region on which at least a part of the photosensitive adhesive is formed in a surface of the one substrate where the photosensitive adhesive is formed,
- wherein, in the applying light, light incident on the photosensitive adhesive layer is reflected by the metal layer, and the photosensitive adhesive in the first region is further cured than a photosensitive adhesive in a second region deviated from the first region.

* * * * *